United States Patent
Yamada

[11] Patent Number: 5,910,901
[45] Date of Patent: Jun. 8, 1999

[54] LOGIC SIMULATOR

[75] Inventor: Naoki Yamada, Hamamatsu, Japan

[73] Assignee: Yamaha Corporation, Hamamatsu, Japan

[21] Appl. No.: 08/783,564

[22] Filed: Jan. 15, 1997

[30] Foreign Application Priority Data

Jan. 19, 1996 [JP] Japan ..................... 8-007627

[51] Int. Cl.$^6$ ............... G06F 9/455; G06F 17/50
[52] U.S. Cl. ............................ 364/578; 364/490
[58] Field of Search ..................... 364/578, 488, 364/489, 490, 491

[56] References Cited

U.S. PATENT DOCUMENTS

| | | | |
|---|---|---|---|
| 4,961,156 | 10/1990 | Takasaki | 364/578 |
| 5,051,938 | 9/1991 | Hyduke | 364/578 |
| 5,164,911 | 11/1992 | Juran et al. | 364/578 |
| 5,177,440 | 1/1993 | Walker et al. | 364/578 |
| 5,363,319 | 11/1994 | Okuda | 364/578 |
| 5,541,861 | 7/1996 | Komoda et al. | 364/578 |

Primary Examiner—Kevin J. Teska
Assistant Examiner—Russell W. Frejd
Attorney, Agent, or Firm—Pillsbury Madison & Sutro LLP

[57] ABSTRACT

A logic simulator, which is capable of running logic simulations in a short period of time by eliminating operations relating to portions of a logic circuit which have previously been developed. A simulation performing section runs a logic simulation based on a net list and an input test vector, and outputs an output test vector which expresses the results. A macro generating section generates ROM code for a ROM equivalent to the logic circuit being simulated based on the input test vector and the output test vector, and stores this as a ROM macro. When the net list references the ROM macro in subsequent logic simulations, the simulation performing section refers to the ROM code of the ROM macro.

15 Claims, 3 Drawing Sheets

LOGIC SIMULATOR

BACKGROUND OF THE INVENTION

1. Technical Field of the Invention

The present invention relates to logic simulators used in the logic design of LSI circuitry, a logic simulation method for simulating operations of logic circuits, and a medium on which is recorded a program for simulating operations of logic circuits.

2. Background Art

In the development of LSI circuits, previously developed LSI logic circuits are often reused to further develop newer LSI circuits. FIGS. 4 and 5 show an example thereof. First, the LSI circuit shown in FIG. 4 is composed of a logic circuit A provided with functional macros A1~A4 having predetermined functions. The LSI circuit shown in FIG. 5 uses the LSI circuit of FIG. 4 as is, while including logic circuits B, C and D in addition to logic circuit A.

Developing LSI circuits by reusing previously developed logic circuits in this manner is an extremely effective means of reducing development costs. For example, in order to make an LSI circuit, a mask is necessary in order to form the elements and wiring comprising the logic circuit on a semiconductor wafer. Therefore, a mask pattern must be designed in order to obtain a mask for the development of each new LSI circuit. However, when a plurality of LSI circuits contain the same logic circuit A as in the above example and are made by the same production process, the same mask pattern can be used for the identical logic circuits A, or the mask pattern can be used by shrinking in response to an increase in the scale of the circuit. Therefore, when the LSI circuit shown in FIG. 4 is developed before the LSI circuit in FIG. 5 is developed, then it is possible to eliminate the development steps required for logic circuit A. Additionally, reusing previously developed logic circuits in this way is an effective means to use when mask pattern data cannot be reused because a plurality of LSI circuits have been made by different production processes. This is because the previously developed logic circuits have already been confirmed to be capable of functioning correctly when first lain on an LSI circuit, so that logic tests are not required on the finer portions of the new LSI circuits in the development stage.

As mentioned above, when LSI circuits have a common logic circuit, the number of development steps for each LSI circuit can be reduced by reusing the design data for that portion. However, in logic simulations performed during the logic design stage, the propriety of the logic functions in each LSI circuit overall must be tested, so that even if the LSI circuits have common logic circuits, logic simulations are duplicated on that portion as well. For this reason, duplicate calculations which are not actually necessary must be performed, as a result of which the amount of time required for the simulation increases. This can be explained in further detail as follows.

First, when a logic simulation is run on the LSI circuit shown in FIG. 4, the designer creates a net list corresponding to the logic circuit A and an input test vector which specifies the input signal waveforms to be applied to the logic circuit A. Here, the net list is data defining the structure of the logic circuit which is to be simulated. In the case of the example shown in FIG. 4, it is composed of data indicating that logic circuit A contains functional macros A1~A4, and that each functional macro is connected as shown in the drawing. Then, the net list and the input test vector are applied to the logic simulator, and the logic simulation of logic circuit A is run. In this logic simulation, the changes in the signal values (events) occurring at each node within the circuit due to the introduction of the input test vectors to the logic circuit A is sequentially calculated, and the output test vector finally outputted from the output terminals in the logic circuit A is determined. The designer decides whether or not the logic functions of the logic circuit A are proper based on this output test vector.

Next, performing a logic simulation of the LSI circuit shown in FIG. 5, the designer prepares a net list corresponding to the logic circuits to be lain on this LSI circuit, and an input test vector corresponding to the logic circuits. In the net list, it is possible to reuse that which was made in the development of the LSI circuit of FIG. 4 for the portion corresponding to logic circuit A. Then, the net list and input test vector are applied to the logic simulator, and the logic simulation is run. In this logic simulation, the logical function of the LSI circuit overall must be tested, so that the simulation is run with the logic circuit A operating. Therefore, the logic simulator must perform calculations on the events in the nodes within logic circuit A, so that the time required to perform the simulation becomes longer due to these calculations.

As explained above, when developing LSI circuits using previously developed logic circuits, there is conventionally a problem in that calculations must be duplicated even if the propriety of the logic circuits has been confirmed, so that the simulation is unnecessarily prolonged.

SUMMARY OF THE INVENTION

The present invention has been made in view of this situation, and has the object of offering a logic simulator, a logic simulation method, and a medium on which is recorded a program for simulating operations of logic circuits, which markedly reduce calculations relating to portions of logic circuits which have already been developed when running a simulation of a logic circuit containing such previously developed portions, thereby allowing logic simulations to be run in a short period of time even in large-scale logic circuits.

The present invention offers a logic simulator for simulating operations of a logic circuit composed of a plurality of logic elements, comprising a simulation performing section which, based on input signal data representing input signals of the logic circuit and circuit data representing the functions of the plurality of logic elements and the states of connection between the logic elements, outputs output signal data representing simulated signals outputted from the logic circuit when supplied with the input signal data; and a ROM macro generating section which, based on the input signal data and the output signal data, outputs output signal data corresponding to the input signal data when supplied with the input signal data.

Another aspect of the present invention offers a logic simulator for simulating operations of a logic circuit composed of a plurality of logic elements, comprising a simulation performing section which, based on input signal data representing input signals of the logic circuit and circuit data representing the functions of the plurality of logic elements and the states of connection between the logic elements, outputs output signal data representing simulated signals outputted from the logic circuit when supplied with the input signal data.

The simulation performing section, when performing simulations of the logic circuit, simulates signals outputted from the logic circuit by using output signal data obtained from an assigned ROM macro in cases wherein the circuit data includes data assigning the ROM macro which outputs the output signal data for a logic circuit corresponding to the input signal data when supplied with the input signal data.

Another aspect of the present invention offers a logic simulation method for simulating operations of a logic circuit composed of a plurality of logic elements, comprising steps of simulating signals outputted from the logic circuit when supplied with input signal data, based on the input signal data representing input signals of the logic circuit and circuit data representing the functions of the plurality of logic elements and the states of connection between the logic elements; and generating a ROM macro which outputs output signal data corresponding to the input signal data when supplied with the input signal data, based on the input signal data and the results of the simulation.

Another aspect of the present invention offers a logic simulation method for simulating operations of a logic circuit composed of a plurality of logic elements, which simulates signals outputted from the logic circuit when supplied with input signal data, based on the input signal data representing input signals of the logic circuit and circuit data representing the functions of the plurality of logic elements and the states of connection between the logic elements; comprising a step of simulating signals outputted from the logic circuit by using output signal data obtained from an assigned ROM macro in cases wherein the circuit data includes data assigning the ROM macro which outputs the output signal data for a logic circuit corresponding to the input signal data when supplied with the input signal data.

Another aspect of the present invention offers a medium on which is recorded a program for simulating operations of a logic circuit composed of a plurality of logic elements by means of a computer. The program includes the steps of simulating signals outputted from the logic circuit when supplied with input signal data, based on the input signal data representing input signals of the logic circuit and circuit data representing the functions of the plurality of logic elements and the states of connection between the logic elements; and generating a ROM macro which outputs output signal data corresponding to the input signal data when supplied with the input signal data, based on the input signal data and the results of the simulation.

Another aspect of the present invention offers a medium on which is recorded a program for simulating operations of a logic circuit composed of a plurality of logic elements, which simulates signals outputted from the logic circuit when supplied with input signal data, based on the input signal data representing input signals of the logic circuit and circuit data representing the functions of the plurality of logic elements and the states of connection between the logic elements by means of a computer. The program includes a step of simulating signals outputted from the logic circuit by using output signal data obtained from an assigned ROM macro in cases wherein the circuit data includes data assigning the ROM macro which outputs the output signal data for a logic circuit corresponding to the input signal data when supplied with the input signal data.

According to the present invention as described above, instead of simulating a logic circuit being simulated as is, a simulation is run while replacing portions for which simulations have previously been run with logically equivalent ROM macros, so that a logic simulation can be performed in a short time even in a large-scale logic circuit.

PREFERRED EMBODIMENTS OF THE INVENTION

In order to make the present invention easier to understand, embodiments of the invention will be explained below. These embodiments show only some possible forms of the present invention and are not meant to limit the scope of the invention; modifications may be made as long as they do not counter the gist of the invention.

A. First Embodiment

Figure 1:
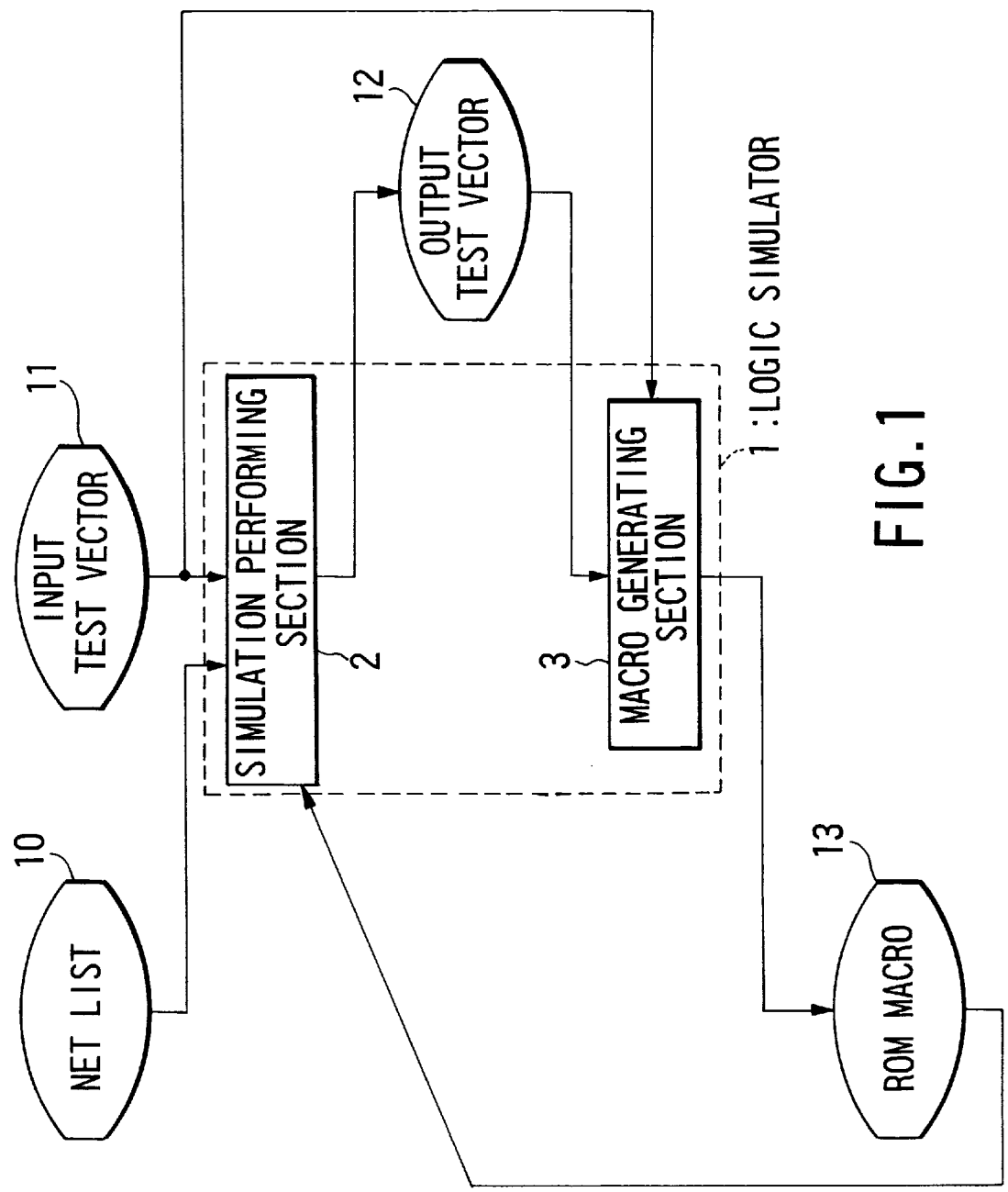
FIG. 1 is a diagram showing the structure of a logic simulator according to a first embodiment of the present invention.

FIG. 1 shows the structure of a logic simulator 1 according to a first embodiment of the present invention. As shown in FIG. 1, the logic simulator 1 comprises a simulation performing section 2 and a macro generating section 3. First, the simulation performing section 2 runs a logic simulation based on the net list 10 and the input test vector 11, then outputs the result as an output test vector 12.

As mentioned above, the net list 10 are data defining the structure of the logic circuit being simulated. The input test vector 11 is data patterned from the input signals to the input terminals in the logic circuit, wherein a single pattern is composed of the instantaneous values of the input signals at the same instant, and these patterns are arranged in a temporal series. The output test vector 12 is data patterned from the output signals of the logic circuit as calculated by the logic simulation.

The actual simulation functions performed by the simulation performing section 2 are no different from those of conventional logic simulators. However, the simulation performing section 2 of the present embodiment runs a logic simulation with reference to a ROM macro 13 when such an instruction is included in the net list 10, so that the logic simulation can be performed with a minimal number of calculations.

The macro generating section 3 generates a ROM code for a ROM which has logic functions equivalent to the logic circuit being simulated, based on the input test vector 11 applied to the simulation performing section 2 and the output test vector 12 from the simulation performing section 2. This ROM code is given a suitable macro name, and stored as a ROM macro 13. The ROM macro stored in this manner is referenced by the simulation performing section 2 when running the subsequent logic simulation. Then, when the net list 10 contains a reference to the ROM macro 13, the ROM code of this ROM macro 13 is used in the calculation of events.

Figure 4:
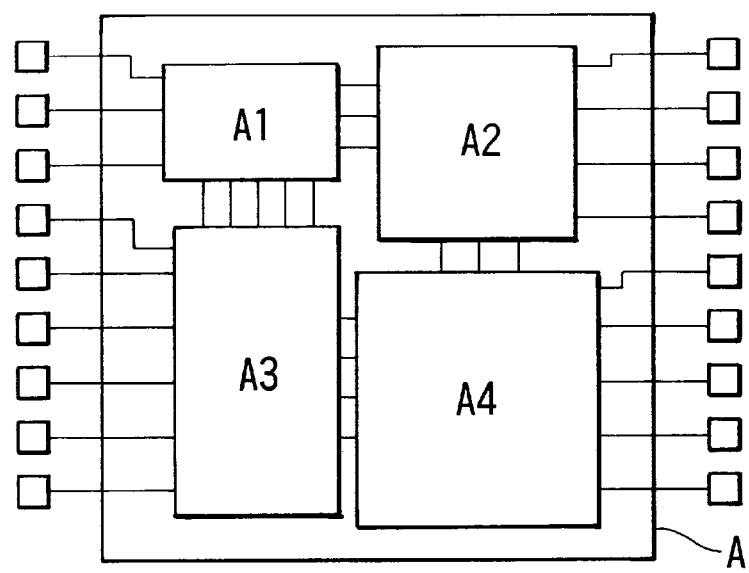
FIG. 4 is a diagram for explaining a conventional logic simulation.

Hereinbelow, the operations of the present embodiment will be explained for the case wherein a logic simulation is run on the LSI circuits of FIGS. 4 and 5. First, a net list 10 corresponding to the LSI circuit of FIG. 4 and an input test vector 11 are applied to the simulation performing section 2, and a logic simulation is run. During this logic simulation, the patterns forming the input test vector 11 are referenced one pattern at a time by the simulation performing section 2. Then, the events occurring in each node within the logic circuit A by applying the patterns are sequentially calculated, and the output signals outputted from the output terminals of logic circuit A in response to each pattern are determined. Then, the output signals determined in this manner are outputted as the output test vector 12.

The macro generating section 3 models the logic circuit A by means of a ROM, based on the input test vector 11 and the output test vector 12 of the logic simulation. That is, the patterns forming the input test vector are referenced by the simulation performing section 2, and each pattern of the input test vector is taken as a ROM address each time the output signal pattern of the logic circuit A corresponding to each input test vector pattern is determined, then the output signal pattern of the logic circuit A is mapped onto each address. As a result of this process being run for all patterns forming the input test vector 11, it is possible to obtain a ROM code for a ROM logically equivalent to the logic circuit A. The macro generating section 3 gives this ROM code a macro name (for example, the macro name "A") assigned by the user of the logic simulator 1, and stores this as a ROM macro 13.

Figure 2:
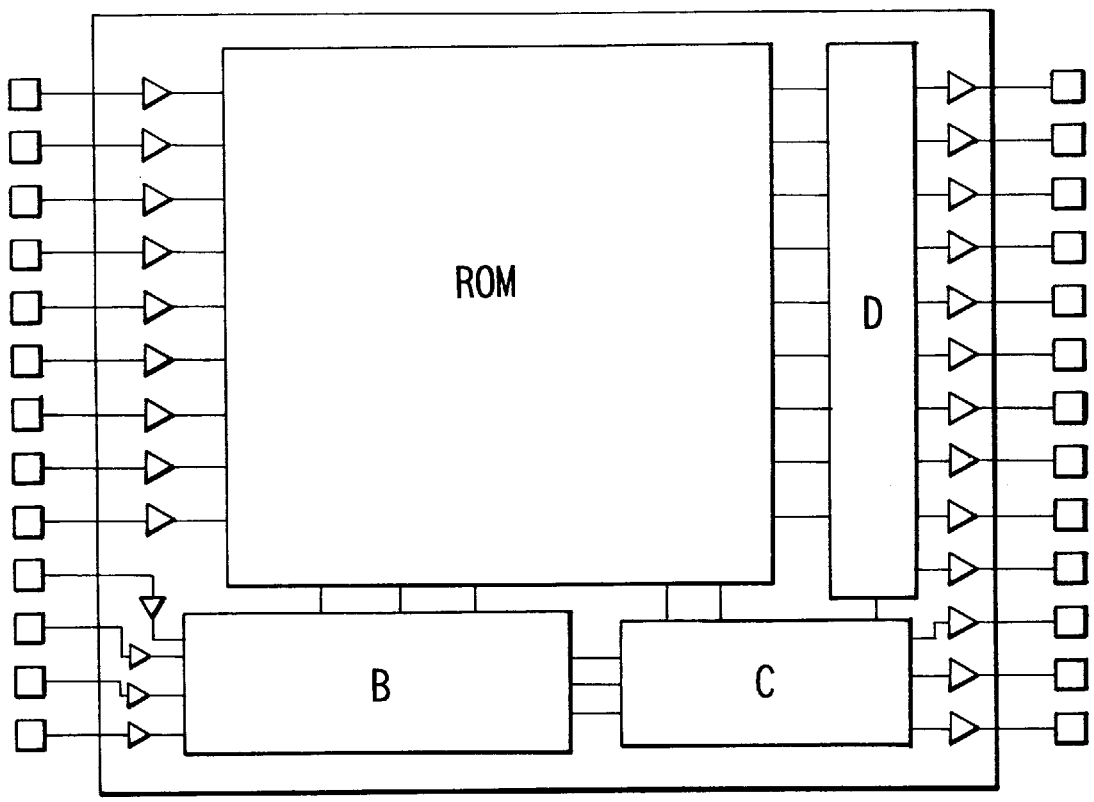
FIG. 2 is a diagram for explaining a logic simulation performed by the first embodiment of the present invention.

Next, the case wherein a logic simulation is run of the LSI circuit of FIG. 5 will be explained. In this case, instead of writing the structure of the logic circuit A in the LSI circuit, the designer includes the macro name of the ROM code which is equivalent to the logic circuit A and stored in macro generating section 3 as ROM macro 13, when preparing a net list 10. That is, the net list prepared for the logic circuit has the logic circuit A replaced with a ROM macro as shown in FIG. 2. Then, the net list 10 prepared in this way is applied to the simulation performing section 2 along with the input test vector 11.

As a result, the simulation performing section 2 runs a logic simulation on the logic circuit shown in FIG. 2. During this logic simulation, when there is a change in the input signals to the ROM macro equivalent to the logic circuit A, stored data corresponding to the address given by the input signal values to the ROM macro at that point in time are read from the ROM code in the ROM macro 13, and these are treated as events representing the output signals of the logic circuit A. Thus, there are no calculations for the events occurring within the logic circuit A, and the output signals are determined simply by referring to the ROM macro 13, as a result of which a logic simulation is run on the LSI circuit overall while reducing the number of calculations by the number required for logic circuit A.

Figure 5:
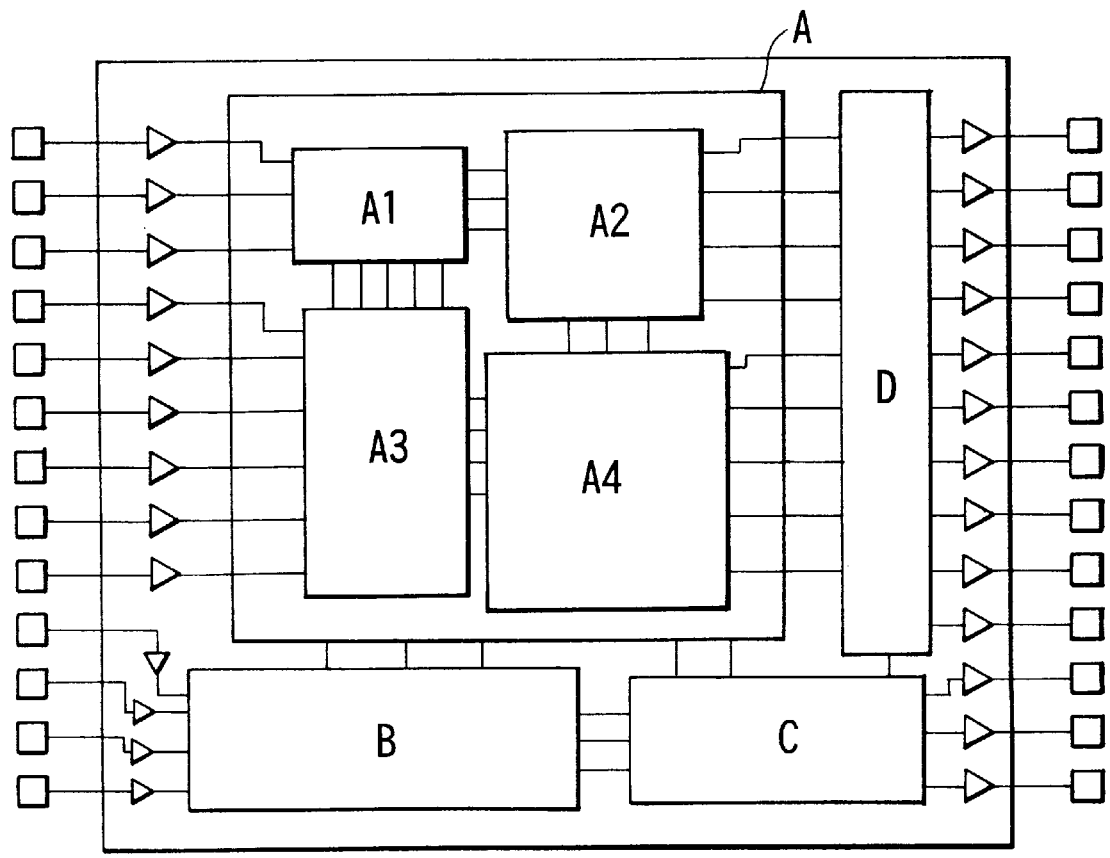
FIG. 5 is a diagram for explaining a conventional logic simulation.

If necessary, a ROM macro 13 can be generated by using the input test vector and output test vector for this logic simulation, and this ROM macro 13 can be used in a logic simulation for an even larger-scale LSI circuit which includes the LSI circuit shown in FIG. 5.

B. Second Embodiment

In the logic design of LSI circuits, once the structure of a logic circuit is settled to a certain degree, a logic simulation is run while considering the delays due to the logic elements forming the logic circuit. In the present embodiment, the present invention is applied to a logic simulation which takes these delays into consideration.

In the present embodiment, when the simulation performing section 2 in FIG. 1 runs a logic simulation, the delay due to each logic element in the logic circuit is considered in order to determine the time at which each event will occur.

The macro generating section 3 monitors the results of the logic simulation run by the simulation performing section 2, and in addition to editing ROM code as with the above-described first embodiment, determines the delay time from the moment at which the patterns forming the input test vector are applied until the output signals of the logic circuit change. Then, as a model of the logic circuit being simulated, a macro composed of a ROM and a delay element group is created as shown in FIG. 3.

Figure 3:
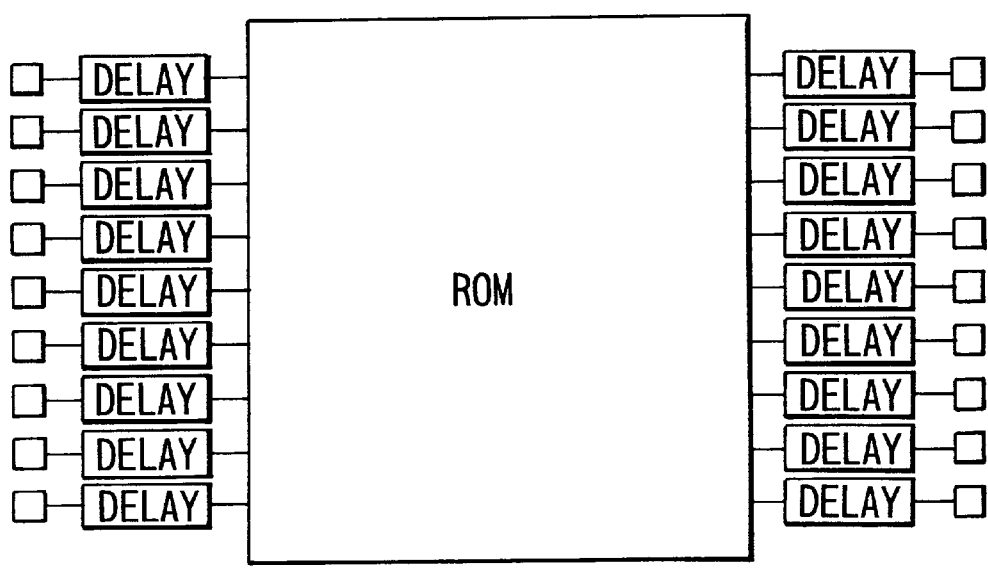
FIG. 3 is a diagram for explaining the procedures of a macro generating section of a second embodiment of the present invention.

In FIG. 3, the ROM models only the logical functions of the logic circuit being simulated, and has the same number of input terminals and output terminals as the logic circuit. The procedure for preparing the data stored in the ROM are the same as those explained for the first embodiment.

The delay element group models the delay properties of the logic circuit. The logic circuit has many signal routes, and the delay time from the moment the input signals are changed until the moment the output signals change generally differs depending on the output terminal. The macro generating section 3 sets the delay times until the output signals are obtained from the logic circuit for each corresponding delay element.

Additionally, depending on the logic circuit, there are those having a structure wherein signals inputted from separate input terminals are transmitted to the same output terminal, so that the delay time until the output signal changes usually differs according to the input signal. In order to handle this type of situation, delay elements are provided in front of the input terminals of the ROM. When identical output signals have different delay times due to the patterns, the macro generating section 3 inspects the input signals which trigger changes in the output signals for each pattern. Then, the amount of the delay of each delay element to which an input signal is inputted is adjusted so that a difference appears in the delay time for each pattern as per the results of the simulation.

When an even larger-scale LSI circuit is to be developed using the logic circuit of this simulation, a logic simulation is run using a ROM macro as prepared above.

C. Other Embodiments

While embodiments of the present invention have been explained above, the scope of application of the present invention is not necessarily limited thereto, and various modifications are possible within a range such as not to fall outside of the technical gist of the present invention. For example, while the ROM macros were prepared based on input test vectors inputted into logic circuits being simulated and output test vectors obtained from the logic circuits, it is possible to model only a portion instead of modeling the entire circuit being simulated. That is, the input signals and output signals of arbitrary logic circuits contained in the logic circuit being simulated can be observed, and ROM macros can be created based on these observations. In this way, it is possible to create and store ROM macros for only those portions of the LSI circuit being simulated which have a possibility of being reused in other LSI circuits.

I claim:

1. A logic simulator for simulating operations of a logic circuit composed of a plurality of logic elements, the logic simulator comprising:

a simulation performing section which, based on input signal data representing input signals of said logic circuit and circuit data representing the functions of said plurality of logic elements and the states of connection between said logic elements, outputs output signal data representing simulated signals outputted from said logic circuit when supplied with said input signal data; and a ROM macro generating section which, based on said input signal data and said output signal data, outputs output signal data corresponding to said input signal data when supplied with said input signal data, wherein said circuit data includes data assigning a ROM macro representing a portion of said logic circuit, and said simulation performing section simulates signals outputted from said logic circuit by using output signal data obtained by the assigned ROM macro.

2. The logic simulator of claim 1, wherein said input signal data is used as an address for a ROM.

3. A logic simulator for simulating operations of a logic circuit composed of a plurality of logic elements, the logic simulator comprising:

a simulation performing section which, based on input signal data representing input signals of said logic circuit and circuit data representing the functions of said plurality of logic elements and the states of connection between said logic elements, outputs output signal data representing simulated signals outputted from said logic circuit when supplied with said input signal data; and a ROM macro generating section which, based on said input signal data and said output signal data, outputs output signal data corresponding to said input signal data when supplied with said input signal data.

wherein said ROM macro generating section generates a ROM macro comprising a ROM modeling said logic circuit and a delay element modeling input-to-output response delay of said logic circuit.

4. The logic simulator of claim 3, wherein said input signal data is used as an address for a ROM.

5. A logic simulator for simulating operations of a logic circuit composed of a plurality of logic elements, the logic simulator comprising:

a simulation performing section which, based on input signal data representing input signals of said logic circuit and circuit data representing the functions of said plurality of logic elements and the states of connection between said logic elements, outputs output signal data representing simulated signals outputted from said logic circuit when supplied with said input signal data; and a ROM macro generating section, which based on said input signal data and said output signal data, outputs ROM code which is stored as a ROM macro, wherein said simulation performing section, when performing simulations of said logic circuit, simulates signals outputted from said logic circuit by using said ROM code stored as the ROM macro for a logic circuit which is a subset of said logic circuit.

6. The logic simulator of claim 5, wherein said ROM macro includes a delay element which models input-to-output response delay of said logic circuit.

7. The logic simulator of claim 5, wherein said input signal data is used as an address for a ROM.

8. A logic simulator for simulating operations of a logic circuit composed of a plurality of logic elements, the logic simulator comprising:

simulation performing means for outputting, based on input signal data representing input signals of said logic circuit and circuit data representing the functions of said plurality of logic elements and the states of connection between said logic elements, output signal data representing simulated signals outputted from said logic circuit when supplied with said input signal data; and ROM macro generating means for outputting, based on said input signal data and said output signal data, output signal data corresponding to said input signal data when supplied with said input signal data, wherein said circuit data includes data assigning a ROM macro representing a portion of said logic circuit and said simulation performing means simulates signals outputted from said logic circuit by using output signal data obtained by the assigned ROM macro.

9. The logic simulator of claim 8, wherein said ROM macro includes a delay element which models input-to-output response delay of said logic circuit.

10. The logic simulator of claim 8, wherein said input signal data is used as an address for a ROM.

11. A logic simulator for simulating operations of a logic circuit composed of a plurality of logic elements, the logic simulator comprising:

simulation performing means for outputting, based on input signal data representing input signals of said logic circuit and circuit data representing the functions of said plurality of logic elements and the states of connection between said logic elements, output signal data representing simulated signals outputted from said logic circuit when supplied with said input signal data; and a ROM macro generating means, responsive to said input signal data and said output signal data, for outputting ROM code which is stored as a ROM macro.

wherein said simulation performing means, when performing simulations of said logic circuit, simulates signals outputted from said logic circuit by using said ROM code stored as the ROM macro for a logic circuit which is a subset of said logic circuit.

12. A logic simulation method for simulating operations of a logic circuit composed of a plurality of logic elements, the method comprising the steps of:

simulating signals outputted from said logic circuit when supplied with input signal data, based on said input signal data representing input signals of said logic circuit and circuit data representing the functions of said plurality of logic elements and the states of connection between said logic elements; and generating a ROM macro which outputs output signal data corresponding to said input signal data when supplied with said input signal data, based on the said input signal data and results of the simulating step, wherein said circuit data includes data assigning a ROM macro representing a portion of said logic circuit, and said simulating step includes simulating signals outputted from said logic circuit by using output signal data obtained by the assigned ROM macro.

13. A logic simulation method for simulating operations of a logic circuit composed of a plurality of logic elements, the method comprising the steps of:

simulating signals outputted from said logic circuit, based on said input signal data representing input signals of said logic circuit and circuit data representing the functions of said plurality of logic elements and the states of connection between said logic elements, to provide output signal data; and generating, based on said input signal data and said output signal data, ROM code which is stored as a ROM macro, wherein the step of simulating signals outputted from said logic circuit includes using the ROM code stored as the ROM macro for a logic circuit which is a subset of said logic circuit.

14. A medium on which is recorded a program for simulating operations of a logic circuit composed of a plurality of logic elements by means of a computer, said program including the steps of:

simulating signals outputted from said logic circuit when supplied with input signal data, based on said input signal data representing input signals of said logic circuit and circuit data representing the functions of said plurality of logic elements and the states of connection between said logic elements; and generating a ROM macro which outputs output signal data corresponding to said input signal data when supplied with said input signal data, based on said input signal data and results of the simulating steps, wherein said circuit data includes data assigning a ROM macro representing a portion of said logic circuit, and said simulating step includes simulating signals outputted from said logic circuit by using output signal data obtained by the assigned ROM macro.

15. A medium on which is recorded a program for simulating operations of a logic circuit composed of a plurality of logic elements by use of a computer, the program including the steps of:

simulating signals outputted from said logic circuit, based on said input signal data representing input signals of said logic circuit and circuit data representing the functions of said plurality of logic elements and the states of connection between said logic elements, to provide output signal data; and generating, based on said input signal data and said output signal data, ROM code which is stored as a ROM macro, wherein the step of simulating signals outputted from said logic circuit includes using the ROM code stored as the ROM macro for a logic circuit which is a subset of said logic circuit.

* * * * *